United States Patent
Madurawe et al.

(10) Patent No.: US 6,265,746 B1
(45) Date of Patent: Jul. 24, 2001

(54) HIGHLY RESISTIVE INTERCONNECTS

(75) Inventors: Raminda U. Madurawe, Sunnyvale; Charu Sardana, Milpitas; Peter J. McElheny, Morgan Hill; Richard G. Smolen, Redwood City, all of CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 09/228,001

(22) Filed: Jan. 8, 1999

Related U.S. Application Data

(60) Provisional application No. 60/087,108, filed on May 28, 1998.

(51) Int. Cl.$^7$ .............. H01L 29/76; H01L 29/94; H01L 31/062; H01L 31/113; H01L 31/119
(52) U.S. Cl. .............. 257/368; 257/368; 257/390; 257/751; 257/764; 438/128; 438/618; 438/622; 438/625; 438/627; 438/629; 438/637
(58) Field of Search ............ 257/368, 390, 257/335, 751, 764; 438/128–130, 279–289, 618–638

(56) References Cited

U.S. PATENT DOCUMENTS

| | | |
|---|---|---|
| 4,394,673 | 7/1983 | Thompson et al. . |
| 4,570,328 * | 2/1986 | Price et al. .............. 29/571 |
| 4,675,715 | 6/1987 | Lepselter et al. . |
| 4,727,045 | 2/1988 | Cheung et al. . |
| 4,960,732 * | 10/1990 | Dixit et al. .............. 437/192 |
| 5,008,730 * | 4/1991 | Huang et al. .............. 357/68 |
| 5,010,032 * | 4/1991 | Tang et al. .............. 437/57 |
| 5,159,430 * | 10/1992 | Manning et al. .............. 357/51 |
| 5,232,865 | 8/1993 | Manning et al. . |
| 5,278,099 * | 1/1994 | Maeda .............. 437/192 |
| 5,367,285 * | 11/1994 | Swinehart et al. .............. 338/308 |
| 5,547,881 | 8/1996 | Wang et al. . |
| 5,760,475 * | 6/1998 | Cronin et al. .............. 257/758 |
| 5,882,399 * | 3/1999 | Ngan et al. .............. 117/89 |
| 5,994,757 * | 11/1999 | Ichikawa et al. .............. 257/530 |
| 6,130,161 * | 10/2000 | Ashley et al. .............. 438/687 |

OTHER PUBLICATIONS

F. Whitwer et al. "Influence of titanium capped aluminum on . . . " VLSI Multilevel Interconnection Conf. 1988 Ch–2624 p. 484–90.*
R. Joshi et al. in Applied Phys. Letters Collimated sputtering of Tin/ti liners . . . vol. 61 Nov. 23, 1992.*
R. Uttecht et al. in VMIC Conference IEEE A four level–metal fully planarized interconnection . . . TH–0359–0/91/0000–0020 Jun. 11–12, 1991.*

* cited by examiner

Primary Examiner—Matthew Smith
Assistant Examiner—Granvill D Lee
(74) Attorney, Agent, or Firm—Beyer Weaver & Thomas LLP

(57) ABSTRACT

Provided is a high resistance value vertically-integrated semiconductor interconnect with resistance in the 10 k$\Omega$–10 G$\Omega$ range, and a process to make such highly resistive interconnects together with low resistive interconnects in a precisely controllable manner. In addition, provided is an SRAM cell with highly resistive contact processing for a pull-up resistor.

15 Claims, 5 Drawing Sheets

HIGHLY RESISTIVE INTERCONNECTS

CROSS-REFERENCE TO RELATED APPLICATIONS

This application claims the benefit of the filing date of Provisional Application Ser. No. 60/087,108, entitled HIGHLY RESISTIVE CONTACTS, filed May 28, 1998. This application is related to patent application Ser. No. 09/227,992 filed on Jan. 8, 1999, and entitled METHOD OF FORMING HIGHLY RESISTIVE INTERCONNECTS, and which is now U.S. Pat. No. 6,127,217.

BACKGROUND OF THE INVENTION

The present invention relates generally to semiconductor devices. More particularly, the invention relates to highly resistive interconnects (electrical connections between conductors in different layers of a semiconductor device), methods of making such highly resistive interconnects together with low resistive interconnects, and SRAM cells incorporating such highly resistive interconnects.

The background material and description of the present invention make primary reference to "contacts," that is, interlayer electrical connections between a region of doped silicon (such as a MOS transistor source/drain region) and a metal region. However, the present invention is equally applicable to interlayer electrical connections between two metal regions in a semiconductor device, commonly known as "vias." Where the invention is described with reference to contacts below, it should be understood that the principles are equally applicable to vias where a metal-to-metal interconnects are used, so that the invention is applicable to interconnects generally.

SRAM cells are typically used for data storage in memory and logic devices. These cells act as cross-coupled latches, with one node physically storing a logic level zero, while the second level physically stores a logic level 1. The connections to a power supply and ground maintain the logic levels at the power supply voltages, charging or discharging any small disturbance charge level. Zero standby power dissipation can be achieved with SRAM cells that are build with CMOS transistors. These tend to occupy a large area of silicon (Si), and are not used for high density memory. Instead, resistive load NMOS cross-couple latches are used to reduce silicon area and achieve high cell density.

A diagram of such a cross-couple latch is shown in FIG. 1A. The circuitry for writing data into the latch is not shown. The latch 100 is designed such that one NMOS transistor is off (say N1). That will force the node Vout2 102 to Vcc, and force N2 to be on. Load resistor (Rload) 104b and transistor N2 are ratioed such that when N2 is on, Vout1 is close to Vss. Vout1 106 is forced on the gate of N1, maintaining N1 in its off state. Thus, there is a feedback loop that is consistent in a cross-couple latch that will maintain Vout1 106 near Vss, and Vout2 102 at Vcc as long as the power supplies are activated.

This technique allows for some DC power dissipation, or non zero standby power usage. As one of the transistors in the cross-couple latch is always on, say N2 in this example, there is a current path from Vcc 108 to Vss 110 via Rload 104b and N2. Rload 104b is designed to have a very high resistance to limit this current flow. As every memory cell has one such current path, the total power dissipation is critical for high density memory devices. In order to keep the current level low in a SRAM cell, the load resistance is typically controlled at about 100 KOhm($\Omega$)–10 G$\Omega$, more typically 100 K$\Omega$ to 1 G$\Omega$.

Conventionally, this high resistance is obtained by using a second, very lightly doped (resistor—lower doping achieves a high resistance) polysilicon (poly) layer. FIG. 1B illustrates such a conventional implementation for a portion of a SRAM cell. A $V_{cc}$ bus 152 is connected to a transistor drain 154 by a pair of contacts 156 and 158 linked by a resistor poly layer 160. The transistor 162 also includes a poly gate 164 with a gate electrode 166 and a source 168 which is connected to $V_{ss}$ 170. The resistor poly layer 160 is not co-extensive with the gate poly 164 of the transistor 162, and the contact 158 is typically formed by a complicated "buried" contact process.

The doping on the resistor poly layer 160, which determines the resistance, is not well controlled, and typically leads to large variations in the resistor value. A polysilicon layer has grain boundaries, and the dopant diffuses at different rates through the grains and the grain boundaries. This makes doping of polysilicon imprecise. Hence the resistance value exhibits large variations within adjacent sites on the same die. The resistor poly layer is deposited after the transistor's poly gate electrode layer is deposited. It also has different doping compared to the gate electrode poly layer. The poly load resistor occupies horizontal space in the cell layout, adding to the cell size area of a memory cell. The most common technique to integrate a poly load resistor is by formation of a "buried" contact, noted above. This technique allows a poly resistor to directly contact the Si substrate at the expense of more complicated processing requirements. Thus, this conventional process for generating high resistance requires two levels of poly and involves imprecise doping techniques, and the layout must include a feature (resistor poly) that takes up additional area on the chip.

There are also schemes discussed in the literature, where different concepts are presented in order to reduce SRAM cell size. Some of these techniques use vertically integrated resistor techniques to use up less area. For example, vertically integrated resistors may have poly deposited into vertical vias. The resistance of the poly may be controlled according to different methods. According to a first method, a high resistance contact is obtained by doping the poly with oxygen or nitrogen implantation. Another method of forming high resistance contacts is by not doping the poly at all. While these techniques succeed in reducing cell area, the via fill poly adds process complexity, while the doping and implant techniques add a large degree of variation to the resistor value, as noted above.

Also, high resistance contacts formed by self-aligned silicide processes are known. In one such process, the resistance of a contact is determined by the formation of a metal silicide (or salicide) at the contact/silicon substrate interface. The presence and amount of metal suicide formed reduces the resistance of the contact relative to a contact formed entirely of unaltered metal. Alternatively, metal may be prevented from forming a metal suicide by first converting it to metal nitride by selective Nitrogen implant. However, these high resistances are typically <1–10 K$\Omega$ range, and do not offer the high magnitudes needed for SRAM cells. Furthermore, these silicidation processes are applicable only to contacts since the via's metal-to-metal connection provides no silicon for silicide formation. Further, the process of forming contacts in this way is difficult to precisely control and may result in variability in the resistance value of the contacts obtained by nominally the same processing.

In addition, SRAM cells having side-by-side high and low resistance polysilicon contacts are known. The resistance of the contacts is controlled by doping, with higher resistance contacts being undoped and lower resistance contacts being doped with an ion to decrease resistance. As previously noted, doping or implanting of interconnects to define resistance has the drawback that dopant diffuses at different rates through the grains and the grain boundaries of polysilicon. Thus, the there may be large variations in resistance within adjacent sites on the same die.

Thus, it would be beneficial to be able to form high resistance value interconnects (contacts and/or vias) that can be vertically integrated into fabrication process so that cell size may be minimized and the use a second poly layer and of buried contacts are avoided, while also allowing for precise control of resistance value with relative simple and few process steps. Such a technique would greatly enhance the ability to make high density memory devices at low cost.

SUMMARY OF THE INVENTION

The present invention addresses this need by providing interconnects, preferably with resistances in the 10 kΩ–10 GΩ range, and a process to make such highly resistive interconnects together with low resistive interconnects in a simple, precisely controllable manner.

In addition, the invention provides an SRAM cell with such highly resistive interconnect processing for a pull-up resistor. This can be achieved by manufacturing a highly resistive metal connection as the load resistor to an SRAM cell. An ability to generate low resistance and high resistance connections side-by-side makes it possible to distribute these load resistors across the SRAM cell arrays with a masking option, while using the same process to provide low resistance connections to other nodes of the circuitry.

Refractory metals are commonly used in the industry for barrier metal, and metal cap layers. The former improves the metal to Si interface properties, while the latter improves electromigration properties of the metal. In a preferred embodiment, the present invention makes use of a thin layer of metal, such as a refractory metal, which is chemically converted, for example oxidized or nitridized, to provide a highly resistive barrier between two conductive metal layers. These connections can be made at the surface of a vertical contact or via to facilitate processing and to reduce SRAM cell area.

In one aspect, the present invention generates highly resistive contacts in a process, alongside regular contacts. A preferred application is in very high density SRAM cells, for example. A contact resistor in accordance with the present invention may also be used in any other application that requires very high resistors.

These and other features and advantages of the present invention are described below with reference to the drawings.

DETAILED DESCRIPTION OF THE PREFERRED EMBODIMENTS

Reference will now be made in detail to preferred embodiments of the present invention. Examples of the preferred embodiments are illustrated in the accompanying drawings. While the invention will be described in conjunction with these preferred embodiments, it will be understood that it is not intended to limit the invention to such preferred embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

The present invention addresses this need by providing interconnects, preferably with resistances in the 10 kΩ–10 GΩ range, and a process to make such highly resistive interconnects together with low resistive interconnects. In one preferred embodiment, the invention provides a SRAM cell with highly resistive contact processing for a pull-up resistor.

In accordance with a preferred embodiment of the present invention, a new highly resistive interconnect may be made with an oxidized (or otherwise chemically converted) interface at the top of the interconnect. The interconnect may be formed by standard processing conditions, well known to those of skill in the art. Briefly, after an interlayer dielectric is formed, interconnect holes are etched. Then a barrier layer such as Ti/TiN may be deposited in the holes and annealed. Tungsten (W)-plug fill or another suitable conductive material may be used to completely fill the holes. A polish or etch back technique is used to remove all the metal from the outside of the contact holes. After this, processing may be used to selectively make some interconnects highly resistive, and others less resistive, according to a process such as described below.

Figure 1A:
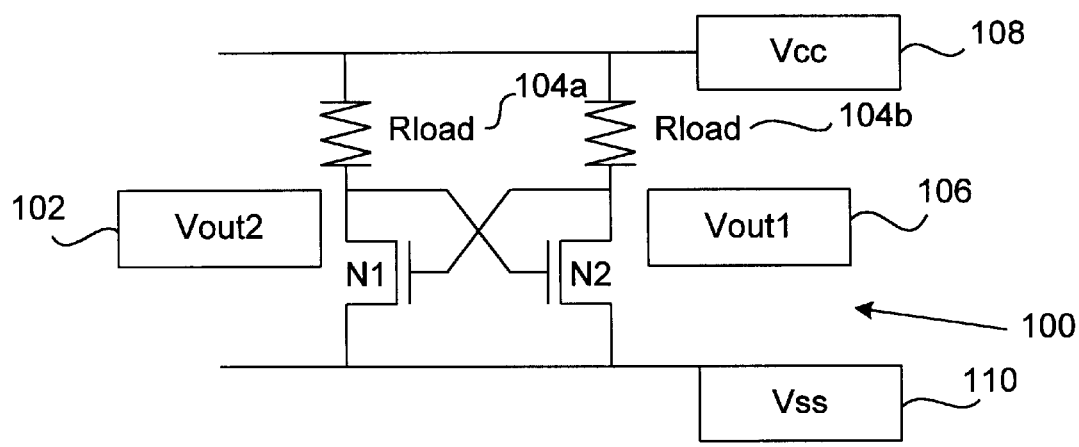
FIG. 1A shows a resistive load NMOS cross-couple latch SRAM cell.
Figure 1B:
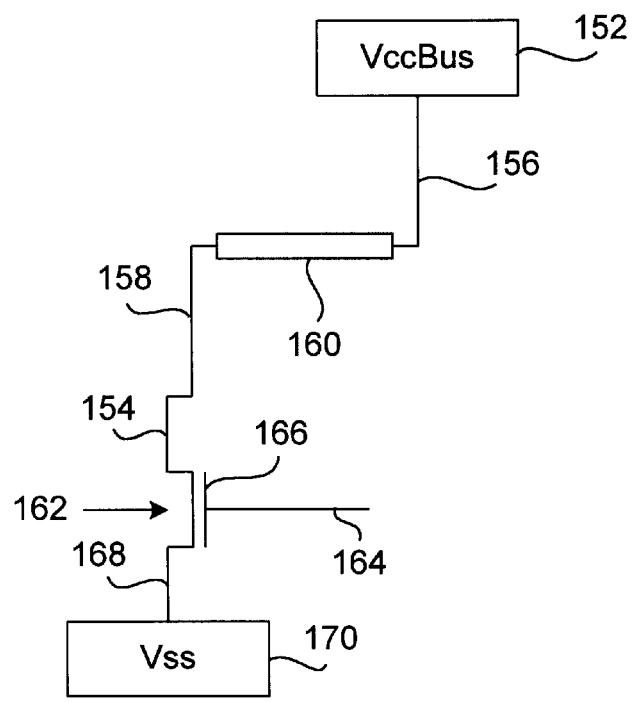
FIG. 1B depicts a circuit diagram of a conventional implementation of a high resistor value poly resistor in a portion of a SRAM.
Figure 2A:
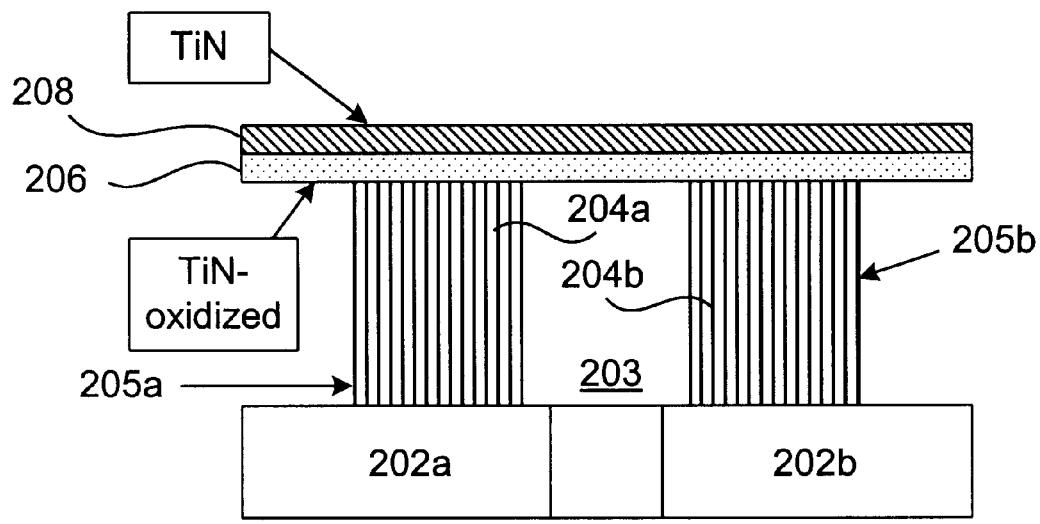
FIGS. 2A and 2B depict cross-sectional views of a portion of a semiconductor wafer showing various stages in a process for forming contacts having different resistances in the same fabrication layer in accordance with a preferred embodiment of the present invention.
Figure 2B:
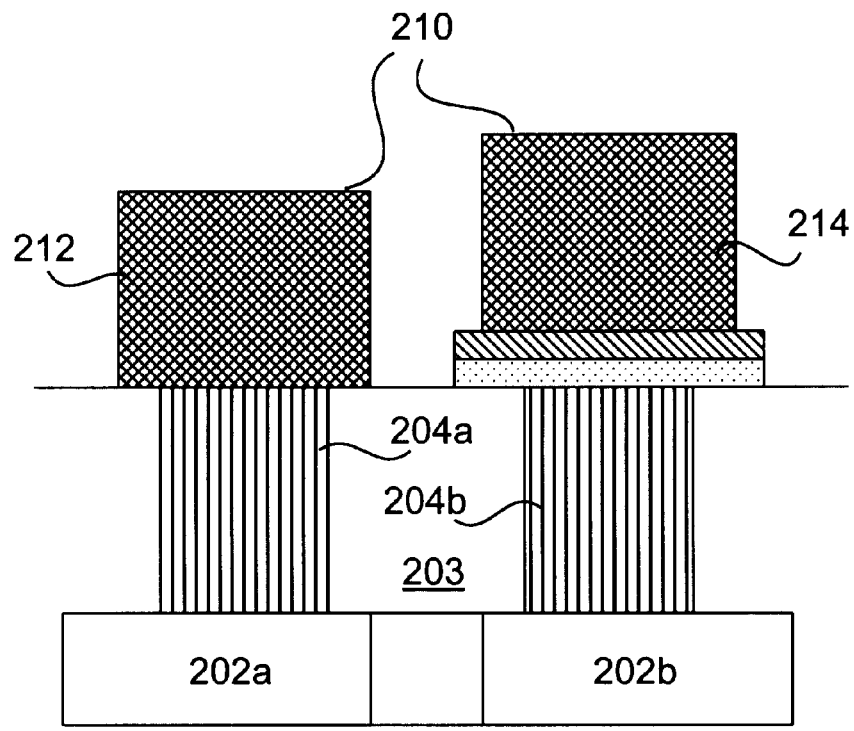

FIGS. 2A and 2B illustrate stages in the processing of high resistance interconnects adjacent to low resistance interconnects in accordance with a preferred embodiment of the present invention. FIG. 2A shows a partially processed state of two conductors (or conductive regions) 202a and 202b that have their respective contacts 204a and 204b, and additional elements formed during the fabrication of the contacts, which is also described with reference to the process flow of FIG. 2C.

Figure 2C:
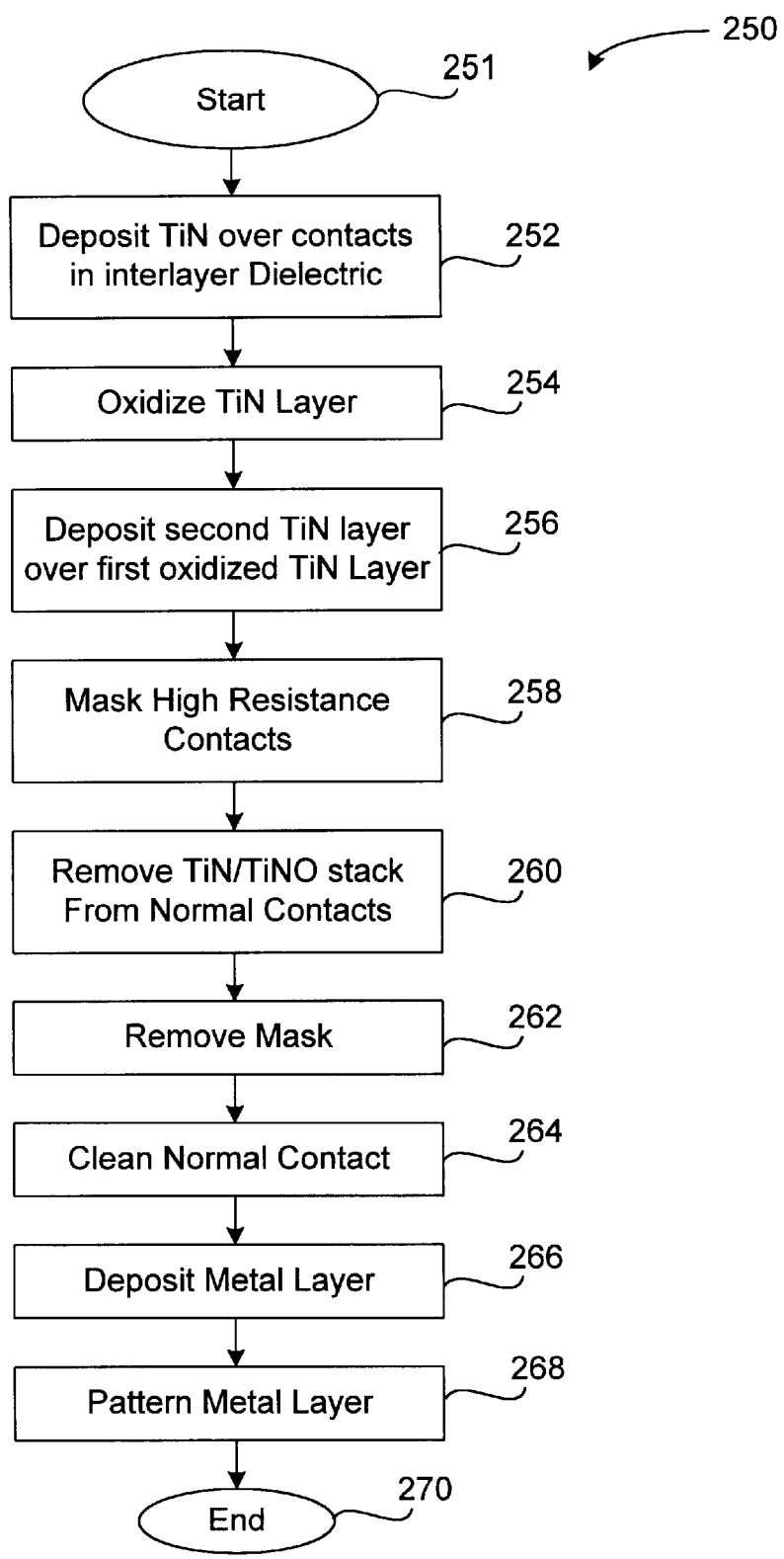
FIG. 2C illustrates a process flow for a method of fabricating contacts having different resistances in the same fabrication layer in accordance with a preferred embodiment of the present invention.

Following the filling of the contact holes 205a and 205b in the interlayer dielectric 203, and the removal of excess metal outside of the contacts, a layer of a metal which is chemically convertible to a highly resistive conducting material 206, preferably with a resistance in the 10 kΩ–10 GΩ range, for example TiN about 10 A to 200 Å in thickness, is deposited over the contacts 204a and 204b, respectively, at a step 252 (process flow 250, FIG. 2C). This layer is not restricted to TiN, and as noted above, in alternative embodiments, could be substituted by any metal layer (e.g., Al, Ti, Ta, Mb, etc.) that can be chemically converted to a highly resistive conducting material. A preferred embodiment of the present invention is described below and illustrated in FIGS. 2A–C using TiN as the metal layer 206.

The resistance of the final contact may be controlled in the range from about 10 kΩ to 10 GΩ by selecting the TiN layer 206 thickness within the 10 to 200 Å range. The TiN may be deposited by well known methods such as chemical vapor deposition (CVD) or sputtering. Following deposition, the TiN is oxidized, at a step 254, for example by a furnace anneal with $N_2$ and $O_2$ flow controlled to consume all TiN layer 206. In this way, a relatively low resistive metal layer may be converted to a high resistive metal layer by chemical reaction. As noted above, this process may also be performed using metal layers 206 composed of other chemically convertible metals. The thickness of the metal layer 206 is selected to accurately control the final resistance between the two conductors.

Next, at a step 256, a second layer of a conducting material, which may be the same as or different than the first deposited material, may be deposited on the first layer 206. The thickness of the second layer should be selected to prevent removal of material from the first layer 206 by etch processing during subsequent cleaning, described below.

In a preferred embodiment of the present invention, illustrated in FIGS. 2A–C, at a step 256, a second layer of TiN 208 about 500 Å to 1 kÅ in thickness may be deposited on the oxidized first TiN layer 206. FIG. 2B illustrates the stage of contact processing following deposition of the second TiN layer 208.

At a step 258, contacts which are desired to have higher resistance, for example contact 204b, are masked, for example with a photoresist mask of the sort used in conventional metal masking. Then, the TiN/TiNO stack 208/206 is removed from the normal (i.e., unmodified, relatively low resistance) contacts, for example 204a, at a step 260. This removal is preferably accomplished by an etching procedure, such as a wet, dry, plasma or sputter etch using materials and conditions well known to those of skill in the art.

When the removal of the TiN/TiNO stack from normal contacts is complete, the photoresist mask is removed, at a step 262, and, at a step 264, any oxidized W on normal contact 204a is cleaned, for example by back sputter using Ar gas according to techniques well known in the art. The TiN layer 208 protects the resistive TiNO layer 206 during cleaning to maintain accurate thickness and hence resistor control.

Then, at a step 266, a metal layer 210 is formed over the contacts. The metal to may be, for example, the first metal layer of several to be deposited during subsequent fabrication steps. FIG. 2B illustrates the stage of contact processing following patterning of the metal layer 210 to obtain the desired connections between a first region 212 and a second region 214, at a step 268. This patterning may be conducted according to procedures well known in the art for metal patterning, such as conventional masking and etching techniques. The process ends at 270. The result is that the interconnect 204a between conductors 212 and 202a is of normal low resistance, while adjacent interconnect 204b between conductors 214 and 202b is of high resistance. As noted above, it should be understood that the TiNO and TiN materials (layers 206 and 208) used in the embodiment of the present invention described above may be replaced by other metals which are chemically convertible into highly resistive conductors, and other conductive materials, respectively.

Figure 3:
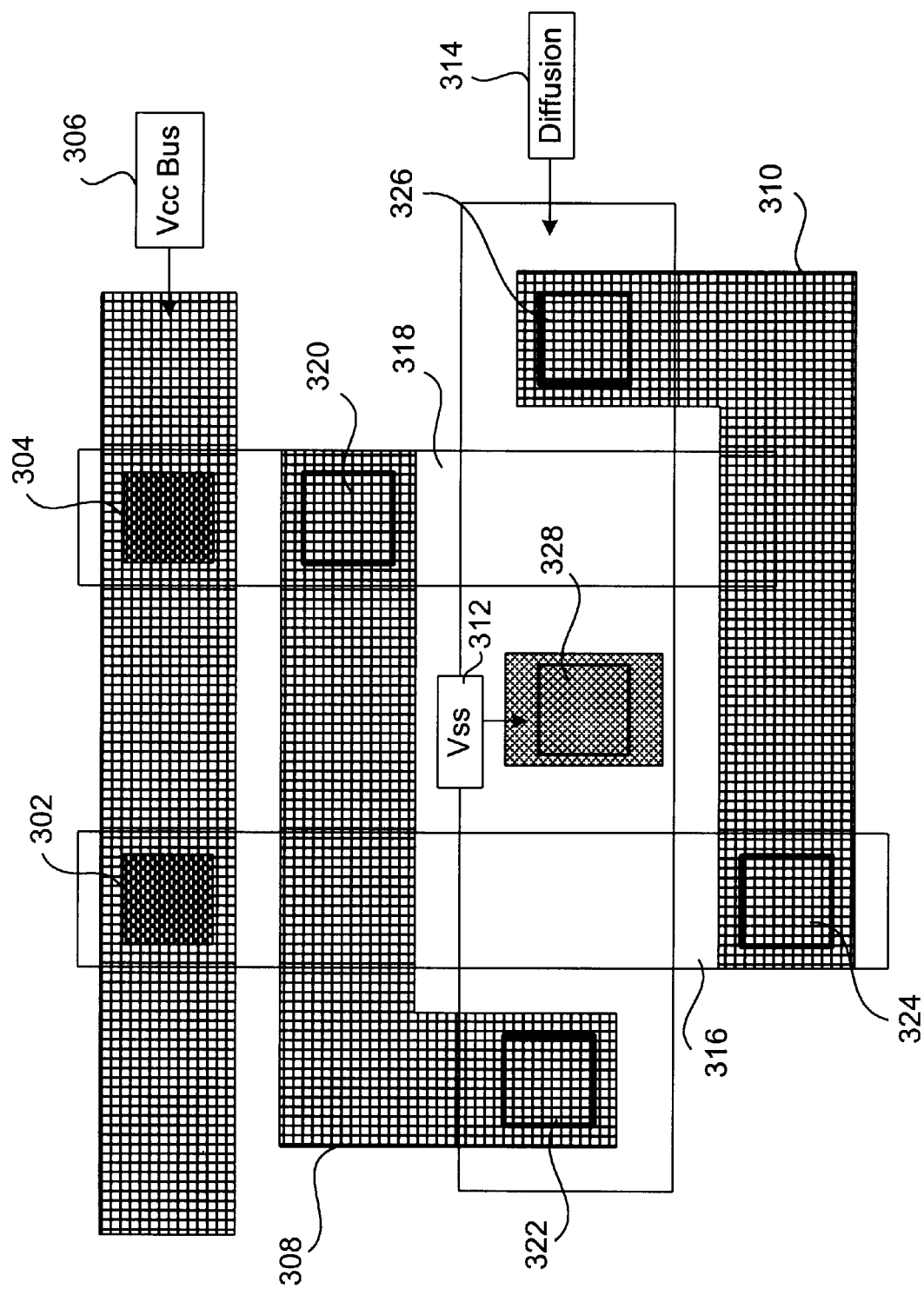
FIG. 3 depicts top transparent plan view a SRAM cell in accordance with a preferred embodiment of the present invention.

In one preferred application of highly resistive contacts formed in accordance with the present invention, illustrated in FIG. 3, a high density SRAM cell layout is greatly simplified by placing the high resistance contact directly on the Vcc bus connecting the drains of NMOS pull-down transistors. FIG. 3 shows a cell layout for an SRAM cell in accordance with the present invention. In this figure, the shaded contacts 302 and 304 on the Vcc bus 306 are the highly resistive contacts, as described above. The remaining contacts 320, 322, 324, 326 and 328 are normal contacts. Contacts 320 and 322 connect gate poly 318 to diffusion 314 via metal line 308. Contacts 324 and 326 connect gate poly 316 to diffusion 314 via metal line 310. Contact 328 connects diffusion 314 to Vss 312.

This layout is an improvement over prior SRAM designs since it eliminates the need for a second polysilicon layer to generate the load resistors for an SRAM cell by a buried contact process, and provides greater control and flexibility of processing and resistance than is possible by doping interconnects or generating silicides at silicon/contact interfaces. The vertically-integrated contacts also allow for increased density over conventional SRAM designs.

Figure 4:
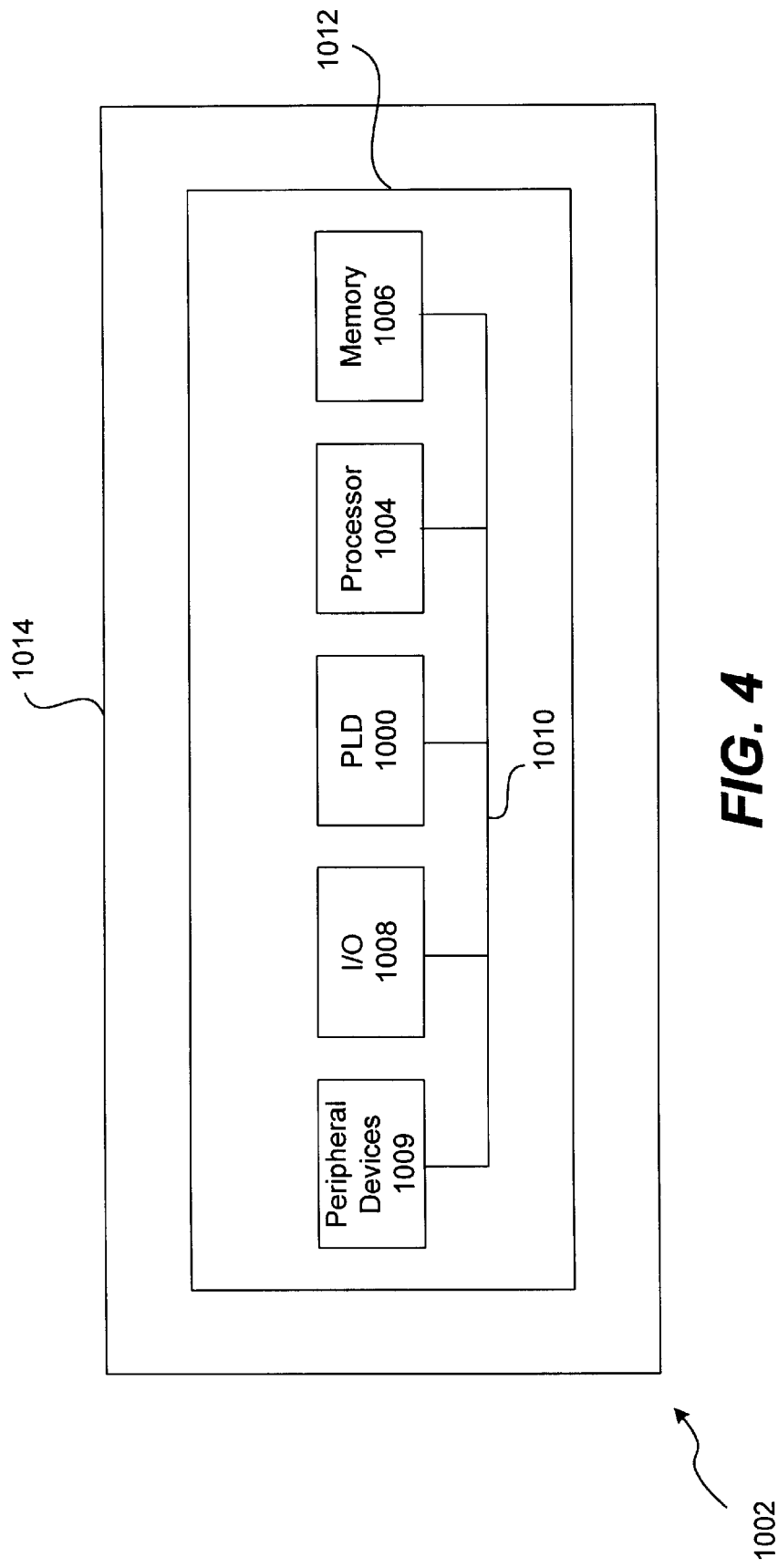
FIG. 4 illustrates one general application of a SRAM cell in accordance with the present invention as part of a PLD in a data processing system.

FIG. 4 illustrates one general application of the high resistance interconnects or SRAM cells containing high resistance contacts in accordance with the present invention as part of a PLD 1000 in a data processing system 1002. The data processing system 1002 may include one or more of the following components: a processor 1004; memory 1006; I/O circuitry 1008; and peripheral devices 1009. These components are coupled together by a system bus 1010 and are populated on a circuit board 1012 which is contained in an end-user system 1014.

The system 1002 can be used in a wide variety of applications, such as computer networking, data networking, instrumentation, video processing, digital processing, or any other application where the advantage of using reprogrammable logic is desirable. The PLD 1000 can be used to perform a variety of different logic functions. For example, PLD 1000 can be configured as a processor or controller that works in cooperation with processor 1004. The PLD 1000 may also be used as an arbiter for arbitrating access to a shared resource in the system 1002. In yet another example, the PLD 1000 can be configured as an interface between the processor 1004 and one of the other components in the system 1002. It should be noted that the system 1002 is only exemplary, and that the true scope and spirit of the invention should be indicated by the following claims.

Thus, in one aspect, the present invention provides a novel structure for highly resistive interconnects, and a process for forming such highly resistive interconnects alongside normal (unmodified) interconnects. The invention also provides a preferred application of the present invention in the fabrication of very high density SRAM cells, for example, as described above. Interconnect resistors in accordance with the present invention may be used in PLDs, or in any other application that requires very high resistors.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An interconnect suitable for use in a semiconductor device, comprising:
   a first layer of a conductive material forming an ohmic contact with a conductive region through an interconnect hole in an interlayer dielectric overlying the conductive region;
   a second layer of material comprising oxidized TiN overlying and in ohmic contact with said first layer of material, said second layer of material being more resistive than said first layer of material; and
   a third layer of a material overlying and in ohmic contact with said second layer of material, said third layer of material being more conductive than said second layer of material.

2. The interconnect of claim 1, wherein the second layer of material increases the resistance of said interconnect to from about 10 k$\Omega$ to 10 G$\Omega$.

3. The interconnect of claim 1, wherein the second layer of material increases the resistance of said interconnect to from about 1 G$\Omega$ to 10 G$\Omega$.

4. The interconnect of claim 1, wherein said conductive region comprises doped silicon, and said interconnect provides a contact between the doped silicon region and a metal region separated by said interlayer dielectric.

5. The interconnect of claim 4, wherein said doped silicon region is a source/drain region of a NMOS transistor.

6. The interconnect of claim 1, wherein said conductive region comprises metal, and said interconnect provides a via between the metal region and a second metal region separated by said interlayer dielectric.

7. The interconnect of claim 1, wherein said first layer comprises tungsten and said third layer comprises TiN.

8. A static random access memory cell formed on a semiconductor substrate, comprising:
   a first vertically-integrated interconnect formed on said substrate, comprising,
   a first layer of a conductive material forming an ohmic contact with a conductive region through an interconnect hole in an interlayer dielectric overlying the conductive region,
   a second layer of material comprising oxidized TiN overlying and in ohmic contact with said first layer of material, said second layer of material being more resistive than said first layer of material, and
   a third layer of a material overlying and in ohmic contact with said second layer of material, said third layer of material being more conductive than said second layer of material; and
   a second interconnect in said layer of said static random access memory, said second interconnect having a lower resistance value than said first interconnect.

9. The SRAM of claim 8, wherein the second layer of material increases the resistance of said higher resistor value interconnect to from about 10 k$\Omega$ to 10 G$\Omega$.

10. The SRAM of claim 8, wherein the second layer of material increases the resistance of said higher resistor value interconnect to from about 1 G$\Omega$ to 10 G$\Omega$.

11. The SRAM of claim 8, wherein said conductive region comprises doped silicon, and said interconnect provides a contact between the doped silicon region and a metal region separated by said interlayer dielectric.

12. The SRAM of claim 11, wherein said doped silicon region is a source/drain region of a NMOS pull down transistor.

13. The SRAM of claim 8, wherein said first layer comprises tungsten and said third layer comprises TiN.

14. The SRAM of claim 8, wherein said SRAM further comprises a $V_{CC}$ bus, a polysilicon gate electrode, and a $V_{SS}$ bus.

15. The SRAM of claim 14, wherein said $V_{CC}$ bus is connected to said polysilicon gate electrode via said higher resistor value vertically integrated interconnect, and said $V_{SS}$ bus is connected to said polysilicon gate electrode via said lower resistor value interconnect.

* * * * *